United States Patent [19]

Bradshaw

[11] 4,429,285

[45] Jan. 31, 1984

[54] FREQUENCY-CONTROLLED VARIABLE-GAIN AMPLIFIERS

[75] Inventor: John L. Bradshaw, Hatboro, Pa.

[73] Assignee: RCA Corporation, New York, N.Y.

[21] Appl. No.: 288,686

[22] Filed: Jul. 31, 1981

[51] Int. Cl.³ ............................ H03G 3/10; H03F 1/34
[52] U.S. Cl. .................................... 330/279; 330/294; 330/109
[58] Field of Search ............... 330/107, 109, 144, 278, 330/279, 294, 52

[56] References Cited

U.S. PATENT DOCUMENTS 3,375,447  3/1968  Beek ...................................... 330/141
4,331,894  5/1982  Gregorian et al. ................... 330/107

OTHER PUBLICATIONS

B. J. Hosticka, "Novel Dynamic CMOS Amplifier for Switched-Capacitor Integrators", *Electronics Letters*, Aug. 16, 1979, vol. 15 No. 17.

"Sampled Analog Filtering Using Switched Capacitor as Resistor Equivalents", Caves et al., *IEEE Journal of Solid State Circuits*, vol. SC12, No. 6, Dec. 1977.

*Primary Examiner*—James B. Mullins
*Assistant Examiner*—Gene Wan
*Attorney, Agent, or Firm*—Joseph S. Tripoli; Henry I. Schanzer

[57] ABSTRACT

One aspect of the invention includes an automatic gain control system (AGC) having a frequency controlled variable gain amplifier stage whose stage gain is a function of a frequency signal applied to a gain control input of the amplifier stage. An input signal to be processed is applied to an input of the amplifier stage. The output of the amplifier is sensed and compared to a reference potential to produce a frequency signal which is applied to the gain control input of the amplifier. Another aspect of the invention includes a frequency controlled variable gain amplifier embodying the invention comprised of an amplifier means having input and feedback networks and whose voltage gain is a function of the impedance of the feedback network with an impedance of the input network. The value of at least one of the feedback and input impedances is varied as a function of an applied sampling frequency signal and the voltage gain of the amplifier is controlled by varying the frequency applied to the feedback and input impedance network whose impedance varies as a function or frequency.

12 Claims, 6 Drawing Figures

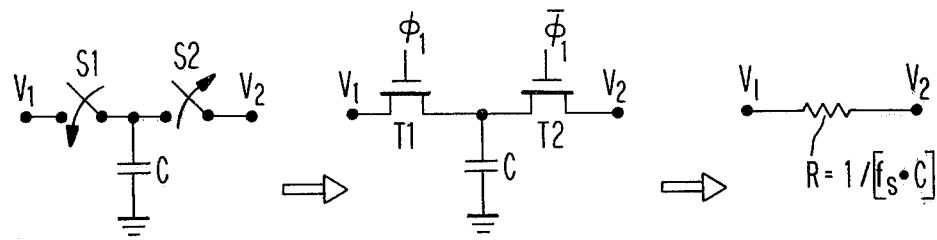
Fig. 1A PRIOR ART  Fig. 1B PRIOR ART  Fig. 1C PRIOR ART
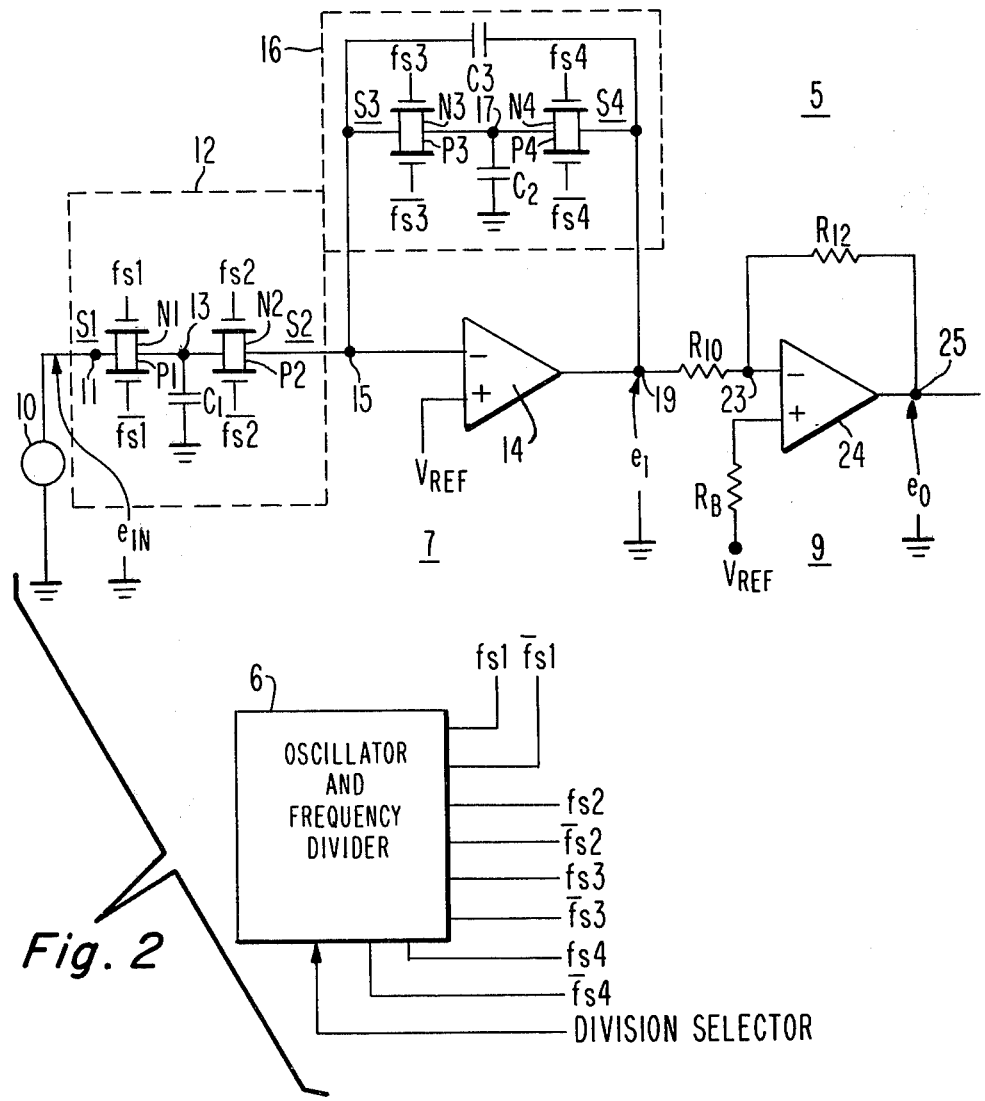
Fig. 2

FREQUENCY-CONTROLLED VARIABLE-GAIN AMPLIFIERS

This invention relates to frequency-controlled variable-gain amplifying means and to automatic gain control (AGC) systems employing such means.

The invention is best understood by reference to the accompanying drawing in which like reference characters denote like components; and in which FIGS. 1A and 1B are schematic diagrams of Prior Art switched capacitor circuits;

FIG. 1C represents the equivalent resistance of the switched capacitor shown in FIGS. 1A and 1B;

FIG. 2 is a schematic diagram of a frequency-controlled variable-gain amplifier, embodying the invention;

Figure 3:
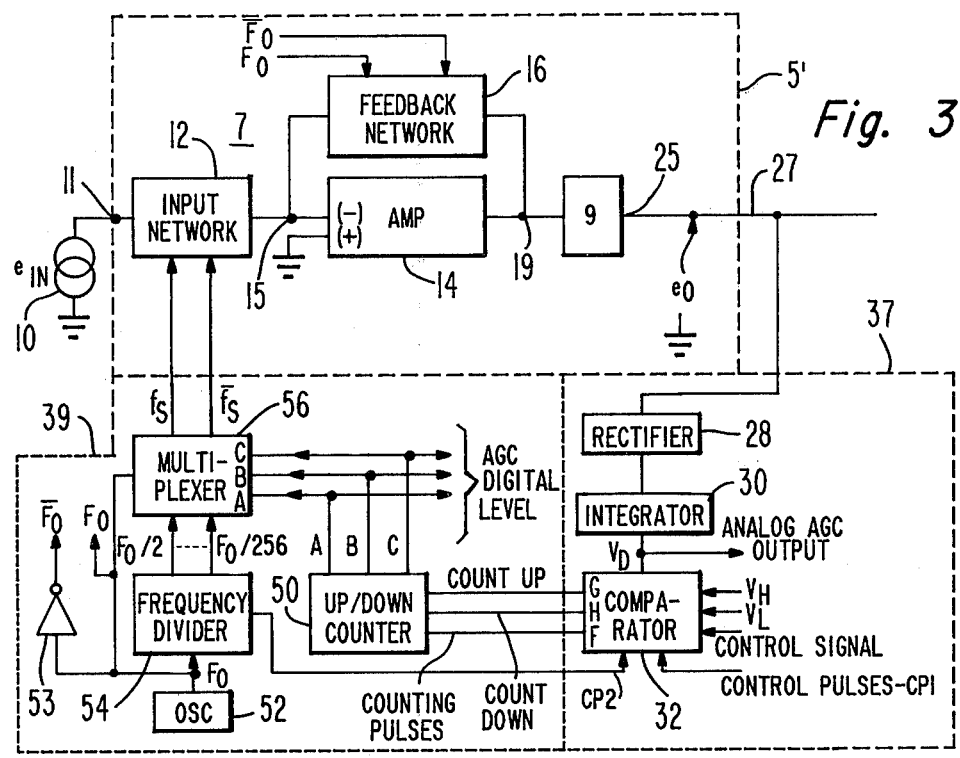
FIG. 3 is a block diagram of an automatic gain control (AGC) system embodying the invention.

It is preferable in some applications to use the frequency of a signal to control certain characteristics (e.g. gain) of a circuit rather than using the amplitude (e.g. voltage or current level) of a signal. Frequency can be controlled or measured very accurately using digital techniques which are affected very little by voltage fluctuations. Researchers in the field of filter theory have recently reported that a capacitor having one plate returned to a fixed point of potential and having its other plate switched between a signal terminal and a second terminal at a frequency which is significantly higher than the signal frequency, behaves as an equivalent resistor whose impedance is inversely proportional to the frequency at which the capacitor is being switched. This is best explained by reference to FIGS. 1A, 1B, and 1C. However, a more detailed theoretical analysis can be found in the references listed below [whose teachings are incorporated herein].

(A) B. J. Hosticka et al. "MOS Sampled Data Recursive Filters Using Switched Capacitor Integrators" *IEEE Journal Of Solid State Circuits*, Vol. SC-12, No. 6, December, 1977; pages 600-608;

(B) J. T. Caves et al. "Sampled Analog Filtering Using Switched Capacitors as Resistor Equivalents", *IEEE Journal of Solid State Circuits*, Vol. SC-12, No. 6, December 1977; pages 592-599; and (C) K. R. Laker "Equivalent Circuits for the Analysis and Synthesis of Switched Capacitor Networks", *Bell System Technical Journal*, Vol. 58, No. 3, March 1979, pages 729-769.

Referring to FIG. 1A assume, initially, that a switch S1 is closed while a switch S2 is open so that a capacitor C is charged to a voltage V1 (which is the amplitude of an input signal). Assume that, subsequently, switch S1 is opened and switch S2 is closed whereby capacitor C is discharged to a voltage V2. The amount of charge (Q) which flows into or from V2 may be expressed as:

$$Q = C(V2 - V1) \tag{1}$$

Now if switches S1 and S2 are alternately opened and closed every $T_S$ seconds, then the current (I) flow into or out of V2 may be expressed as:

$$I = C(V2 - V1)/T_S \tag{2}$$

The value of an equivalent resistor (R), as shown in FIG. 1C, which would perform the same function as the switched capacitor (C) may be expressed as:

$$R = T_S/C \tag{3}$$

If $f_S$ which is defined as the sampling frequency, (i.e. the rate at which the switches S1 and S2 are opened and closed) is equal to $1/T_S$, and if $f_S$ is much greater than the signal frequencies, (i.e. the rate at which V1 and V2 change), then the time sampling of the signal which occurs in this circuit can be ignored and the switched capacitor can be considered as a direct replacement for a conventional resistor. The resistance value of the switched capacitor may then be expressed as:

$$R = 1/f_S C \tag{4}$$

Thus, a capacitor (C) which is switched at a sampling frequency ($f_S$) which is much higher than the input signal (V1) frequency appears as a frequency dependent resistor R having a value equal to $1/f_S C$. Switches S1 and S2 may be replaced by MOS transistors (T1, T2) as shown in FIG. 1B which are turned on and off by means of non-overlapping clock signals $\phi1$ and $\phi2$ of frequency $f_S$, so that only one of the two transistors is turned on at any one time.

A significant advantage of a switched capacitor is that the stability and linearity of its equivalent resistance value is proportional to $1/f_S$ and (in an integrated circuit) is much better than that obtained from a diffused resistor since the insulator of the capacitor in a properly fabricated Metal-Oxide-Semiconductor (MOS) capacitor has essentially ideal characteristics. For example, typical temperature coefficients for the MOS capacitors are less than 10 parts per million. Another important advantage of employing switched capacitors instead of resistors is the high accuracy of the (equivalent) RC time constants that can be obtained with switched capacitors. If a capacitor $C_1$ which is switched at a clock rate of $f_S$ to form an equivalent resistor R1, is connected to a capacitor $C_2$, the resultant time constant ($R_1C_2$) of this network, (where $R_1 = 1/f_S C_1$) is equal to:

$$\tau = R_1 C_2 = C_2/f_S C_1$$

For a given clock rate ($f_S$) the value of the time constant is, therefore, determined by a ratio of capacitor values which makes it insensitive to most processing variations. The capacitance of a unit area is generally uniform across an integrated circuit and it is, therefore, possible to achieve high precision in the capacitor ratio.

Circuits and systems embodying the invention include elements whose impedance may be varied as a function of frequency.

According to one aspect of the invention as shown, for example, in FIG. 3, an automatic gain control (AGC) system embodying the invention includes a frequency controlled variable gain amplifier stage whose voltage gain is a function of the frequency of the signal applied to its gain control input. An input signal to be processed is applied to the input of the amplifier. Means coupled to the output of the amplifier senses the amplitude of its output signal, compares the output signal to a reference voltage, and produces a signal whose frequency is proportional to the gain required to maintain the amplitude of the output signal within a desired range, which is applied to the gain control input of the amplifier.

According to another aspect of the invention, as shown, for example, in FIG. 2, a frequency-controlled variable-gain amplifier stage embodying the invention includes amplifying means having input and feedback networks and whose voltage gain (AV) is a function of the impedance ($Z_F$) of the feedback network to the impedance ($Z_I$) of the input network, where the value of at least one of the feedback and input impedances varies as a function of an applied sampling frequency signal, and where the voltage gain of the amplifying means is controlled by varying the frequency applied to each one of said feedback and input impedances whose impedance varies as a function of frequency.

The circuit of FIG. 2 includes an amplifier arrangement 5 comprised of a first amplifier stage 7 connected in cascade with a second amplifier stage 9. Amplifier stage 7 is comprised of an input network 12 connected between an input terminal 11 and the inverting input node 15 of an operational amplifier (OP-AMP) 14, and a feedback network 16 connected between the output 19 of the operational amplifier and node 15. The input network 12 includes a switch S1 connected between input terminal 11 and an intermediate node 13, a capacitor C1 connected between node 13 and ground, and a switch S2 connected between nodes 13 and 15.

OP-AMP 14 may be, for example, a CA324 manufactured by RCA Corporation. However, any other suitable OP-AMP may be used instead. The non-inverting input (+) of OP-AMP 14 is shown connected to ground, but it may instead be returned by some impedance means to any other suitable point of reference potential.

The feedback network 16 includes a switch S3 connected between node 15 and an intermediate node 17, a capacitor C2 connected between node 17 and ground potential, and a switch S4 connected between nodes 17 and 19. A capacitor C3 is connected between terminals 15 and 19 to stabilize operation of the circuit.

Each one of switches S1, S2, S3, and S4 is a dual transmission gate which is comprised of two insulated-gate field-effect transistors (IGFETs) one of N-conductivity type and the other of P-conductivity type, having their conduction paths connected in parallel to provide good switching action regardless of the value of the signal being switched. Pulse signals $f_{S1}$, $f_{S2}$, $f_{S3}$ and $f_{S4}$ and their complements ($\overline{f_{S1}}$, $\overline{f_{S2}}$, $\overline{f_{S3}}$ and $\overline{f_{S4}}$) are produced by an oscillator and divider circuit 6 for driving the switches S1, S2, S3 and S4. The circuit 6 includes a high frequency clock source which may be a crystal oscillator or some other frequency generating source and a count down chain to produce various frequencies ($f_{S1}$, $f_{S2}$, $f_{S3}$, $f_{S4}$ and their complements), which are coupled to the switches S1, S2, S3 and S4 of amplifier 5. A division selector input provides the control to determine the actual value of the frequency signals and the ratio of the various frequencies to each other. Pulse signals $f_{S1}$ and $\overline{f_{S1}}$ are respectively applied to the gate electrodes of transistors N1 and P1 forming switch S1. Pulse signals $f_{S2}$ and $\overline{f_{S2}}$ are respectively applied to the gate electrodes of transistors N2 and P2, forming switch S2. Pulse signals $f_{S3}$ and $\overline{f_{S3}}$ are respectively applied to the gate electrodes of transistors N3 and P3 forming switch S3. Pulse signals $f_{S4}$ and $\overline{f_{S4}}$ are respectively applied to the gate electrodes of transistors N4 and P4, forming switch S4. Pulse signals $f_{S1}$ and $f_{S2}$ are designed to be non-overlapping whereby when S1 is turned-on (N1 and P1 are conducting) S2 is turned-off (N2 and P2 are non-conducting) and whereby when S2 is turned-on S1 is turned-off. Similarly pulse signals $f_{S3}$ and $f_{S4}$ are designed not to overlap whereby when S3 is turned-on (N3 and P3 are conducting) S4 is turned-off (N4 and P4 are non-conducting) and whereby when S3 is OFF, S4 is ON.

As detailed below, in amplifier circuits embodying the invention, the sampling frequency ($f_{S3}$ and $f_{S4}$) at which the feedback capacitor C2 is switched may be different than the sampling frequency ($f_{S1}$, $f_{S2}$) at which the input capacitor C1 is switched.

Amplifier stage 9 includes an input resistor R10 connected between node 19 and the inverting input node 23 of an operational amplifier (OP-AMP) 24 and a feedback resistor R12 connected between the output 25 of OP-AMP 24 and node 23. A resistor RB is connected between the non-inverting input node (+) of OP-AMP 24 and a reference potential ($V_{REF}$). OP-AMP 24 like OP-AMP 14 may be any suitable operational amplifier.

An input signal source 10 is connected to input terminal 11. Signal source 10 may be any one of a number of signal sources producing signals wnhich may vary over a wide range of amplitude and frequency. However, in the circuit of FIG. 2 the highest input frequency ($f_{IN}$) of the input signal ($e_{IN}$) must be significantly less than the lowest switching or sampling frequencies ($f_{S1}$, $f_{S2}$, $f_{S3}$, $f_{S4}$).

The operation of the circuit of FIG. 2 is best understood by recalling that the switched capacitors (C1 and C2) function as equivalent resistors. In the discussion to follow assume that $f_{S1}$ and $f_{S2}$ are complementary (and non-overlapping) to each other (i.e. $f_{S1} = \overline{f_{S2}}$) and that $f_{S3}$ and $f_{S4}$ are complementary (and non-overlapping) to each other (i.e. $f_{S3} = \overline{f_{S4}}$).

The voltage gain, AV1, of the first amplifier stage 7 is defined as $e_1/e_{IN}$ and may be expressed as:

$$AV1 = e_1/e_{IN} = Z_f/Z_I \quad (5)$$

where: (a) $e_1$ is the signal output of OP-AMP 14; (b) the equivalent impedance ($Z_f$) between nodes 15 and 19 of feedback network 16 is approximately equal to $1/f_{S3}C_2$; and (c) the equivalent impedance ($Z_I$) between nodes 11 and 15 of the input network 12 is equal to $1/f_{S1}C_1$. Substituting the values of $Z_f$ and $Z_I$ into equation 5 yields:

$$AV1 = f_{S1}C_1/f_{S3}C_2 \quad (6)$$

$C_1$ need not be equal to $C_2$ and the capacitors could in fact be some ratio of each other (e.g. $C_1 = aC_2$, where a is a constant, or a fraction). However, in the discussion to follow assume that $C_1$ is made equal to $C_2$. AV1 is then approximately equal to $f_{S1}/f_{S3}$ and hence the voltage gain of the stage is virtually independent of the value of the components (i.e. $C_1$ and $C_2$). AV1 is then primarily dependent on the ratio of the sampling frequencies, and may be expressed as:

$$AV1 = f_{S1}/f_{S3} \quad (7)$$

In the circuit of FIG. 2, $f_{S1}$ and $f_{S3}$ are related in that $f_{S1}$ and $f_{S3}$ are obtained from different portions of a count down circuit in divider 6. $f_{S1}$ is a sub-multiple of $f_{S3}$ and may be expressed as $f_{S1} = f_{S3}/N$, where N is an integer equal to or greater than one (1). Where the count down circuit of FIG. 2 is a binary divider, N is a function of $2^n$ where n represents the number of binary stages and n may be any integer equal to or greater than zero. However, different count down schemes may be used and, in general, N may be any number. The voltage gain of amplifier stage 7 is then $AV1=1/N$. Clearly, for the condition of $C_1$ being equal to $C_2$ and $f_{S1}$ being related to $f_{S3}$ by some fixed constant (i.e. N) the voltage gain is extremely stable.

In contrast to the prior art circuit shown in FIG. 14(a) of the Laker reference (C) cited above, circuits embodying the invention include means for varying the ratio of $f_{S1}$ (and $f_{S2}$) to $f_{S3}$ (and $f_{S4}$). This is achieved by a control means such as the division selector signal coupled to the frequency divider circuit 6 for varying the ratio of $f_{S1}$ and $f_{S2}$ to $f_{S3}$ and $f_{S4}$. Although not discussed in detail, it should be evident that the complements ($\bar{f}_{S1}$, $\bar{f}_{S2}$, $\bar{f}_{S3}$, and $\bar{f}_{S4}$) of the frequency signals can be, and are, varied in a manner which is consistent with the corresponding uncomplemented unprimed signals. The ratio of $f_{S1}$ (and $f_{S2}$) to $f_{S3}$ (and $f_{S4}$) can thus be varied by varying the division ratio (N) or by selecting which output of the divider is coupled to and made $f_{S1}$ (and $f_{S2}$) and which output is coupled to and made $f_{S3}$ (and $f_{S4}$). Hence, the divider chain 6 includes controls whereby $f_{S1}$ or $f_{S3}$ may be varied such that $f_{S1}$ is less than, equal to, or greater than $f_{S3}$. This enables the voltage gain of the amplifier stage 7 to be made less than 1, equal to 1, or greater than 1.

$f_{S1}$ (and $f_{S2}$) may be varied automatically with respect to $f_{S3}$ (and $f_{S4}$) as detailed below with respect to FIG. 3 or else the variation may be programmed or made dependent on extrinsic factors. Whatever the control, the gain of the amplifier can be varied as a function of a difference in frequencies. The difference in the frequencies can be, for example, the different outputs of a count down chain which enables a very exact ratio of frequencies to be generated and hence a very well defined voltage gain mechanism.

The output ($e_1$) of stage 7 is amplified by stage 9 which is a standard operational amplifier stage. The voltage gain (AV2) of amplifier stage 9 defined as the ratio of the output ($e_0$) of amplifier 24 to its input $e_1$ is a known function of $R_{12}$ to $R_{10}$ and may be expressed as:

$$e_0/e_1 = AV2 = R_{12}/R_{10}$$

The overall gain of the first (7) and second (9) cascaded amplifying stages may be expressed as:

$$e_0/e_{IN} = [AV2] \cdot [AV1]$$

$$e_0/e_{IN} = [f_{S1}C_1/f_{S3}C_2] \cdot [R_{12}/R_{10}]$$

The overall voltage gain of stages 7 and 9 may be made greater than 1 by appropriate choice of $R_{12}$ and $R_{10}$ even with $C_1$ equal to $C_2$ and with $f_{S1}$ equal to a portion (less than one) of $f_{S3}$.

By proper design, as outlined above, the circuit of FIG. 2 functions as an amplifier of the input signal at signal frequencies and not as a lossy integrator as described in the above cited reference of K. R. Laker.

The amplifier gain of the circuit of FIG. 2 was varied by varying the sampling frequencies applied to the input network 12 and to the feedback network 16. For some conditions the input network was sampled at a higher frequency than the feedback network and for other conditions the input network was sampled at a lower frequency than the feedback network. Also, several amplifiers were constructed using different combinations of amplifier 5 stages cascaded with like amplifier 5 stages and intermixed with amplifier 9 stages to produce a greater range of voltage gains using the same number of frequencies. This demonstrates the adaptability and ease of gain control available with the circuit of FIG. 2.

The AGC system of FIG. 3 include an amplifier 5', analog-to-digital (A/D) controller circuitry 37, and digital-to-frequency (D/F) converter circuitry 39. In general, the A/D controller 37 senses the amplitude of the amplifier output ($e_0$) and produces digital signals (G, H, F) responsive to the amplitude $e_0$. The digital signals are applied to an UP/DOWN counter 50 contained in the digital to frequency converter 39 and function to control the frequency of the signals ($f_{S1}$ and $\bar{f}_{S1}$) applied to the input network 12 of amplifier 5', which is assumed to be like network 12 of FIG. 2, thereby automatically controlling the amplifier gain.

Amplifier 5' is a frequency-controlled variable-gain switched capacitor amplifier of the type shown in FIG. 2. The gain of amplifier 5' is varied by applying fixed frequency signals $F_0$ and $\bar{F}_0$ to the feedback network 16, which is assumed to be like network 16 of FIG. 2, and variable frequency signals $f_S$ and $\bar{f}_S$ to the input network 12.

The A/D controller 37 includes a rectifier circuit 28 connected at its input via line 27 to the output 25 of amplifier 5'. The output of the rectifier is connected to the input of an integrator 30 whose output ($V_D$) is connected to a comparator 32. Rectifier 28 functions to convert the alternating current (AC) signal ($e_0$) at the output 25 of amplifier 5' into a pulsating direct current (DC) level signal. Integrator 30 functions as a low pass filter to smooth the output of rectifier 28 and produces at its output a DC voltage, $V_D$, whose level is a function of the amplitude of $e_0$ and which is designated as the Analog AGC Output. $V_D$ is applied to the comparator arrangement 32 for comparison with a low reference voltage ($V_L$) and a high reference voltage ($V_H$) produced by a reference source (not shown) which may be a simple voltage divider, a microprocessor or another type of control source. The comparator produces output signals (G, H) which are used to indicate whether $V_D$ is more positive than $V_H$, lies between $V_H$ and $V_L$, or is less positive than $V_L$.

The comparator 32 also includes a control signal input from a control system such as a microprocessor (not shown) which determines whether control pulses CP1 or a low frequency pulse CP2 are coupled to or produced at a signal output F. Thus, comparator 32 includes voltage comparison means and signal control means for generating: (1) a count-UP signal at output G; (2) a count-DOWN signal at output H; and (3) counting pulses at output F. The actual circuitry to implement these functions is known in the art, is highly alternative and is, therefore, not detailed herein.

The digital-to-frequency converter 39 includes means for generating a range of sampling frequency signals ($f_S$ and $\bar{f}_S$) which are selectively applied to the amplifier 5'. Converter 39 includes an oscillator circuit 52 which may be any one of a number of known oscillator circuits capable of producing an output signal of frequency $F_0$. $F_0$ is applied to an inverter 53 to produce $\bar{F}_0$, the inverse of $F_0$. $F_0$ and $\bar{F}_0$ (designed to be non-overlapping) are applied to the gate electrodes of the transistors forming switches S3 and S4 as in FIG. 2 in feedback network 16. The capacitor C2 in feedback network 16 is switched between nodes 15 and 19 at a rate determined by $F_0$ (and $F_0$). The output of oscillator 52 is also applied to a frequency divider circuit 54. The frequency divider has 8 outputs at which are produced signals $F_0/2$, $F_0/4$, $F_0/8$, $F_0/16$, $F_0/32$, $F_0/64$, $F_0/128$, $F_0/256$. The frequency divider 54 circuit may be, for example, a CD4024 manufactured by RCA Corporation. However, any other suitable binary counter divider could be used instead. The oscillator output $F_0$ and selected outputs of the frequency divider are applied to the signal inputs of a multiplexer 56 having three (ABC) input control terminals to which are applied three outputs (A, B, C,) of UP/DOWN counter 50. The ABC control signals determine which one of the frequency signals $F_0$ ... $F_0/256$) applied to the multiplexer is selected for application to the input network 12 of amplifier 5'. By way of example, values of the multiplexer output ($f_S$) produced for different outputs (ABC) of the UP/DOWN counter 50 are given in TABLE I, below.

TABLE I

| A | B | C | Multiplexer Output $f_S$ |
|---|---|---|---|
| 0 | 0 | 0 | $F_0/128$ |
| 0 | 0 | 1 | $F_0/64$ |
| 0 | 1 | 0 | $F_0/32$ |
| 0 | 1 | 1 | $F_0/16$ |
| 1 | 0 | 0 | $F_0/8$ |
| 1 | 0 | 1 | $F_0/4$ |
| 1 | 1 | 0 | $F_0/2$ |
| 1 | 1 | 1 | $F_0$ |

Multiplexer 56 may be, for example, a CD4051 manufactured by RCA Corporation. However, any other multiplexer arrangement may be used instead. The output, ($f_S$ and $\overline{f_S}$) of the multiplexer 56, derived from oscillator 52, is applied to the gate electrodes of the transistors forming switches S1 and S2 input network 12. The frequency divider 54 also produces a low frequency signal CP2 which is applied to comparator 32 as noted above.

To better explain the operation of the system of FIG. 3 the following assumptions are made. Assume that $F_0$ and $\overline{F_0}$ are being applied to switches S3 and S4, respectively, in the feedback network 16 and that $f_S=F_0/16$ and $\overline{f_S}$ are applied to switches S1 and S2, respectively, in the input network 12. Assume also that $e_{IN}$ is, initially, of a value whereby the amplitude of $e_0$ is such that $V_D$ lies in the range between $V_L$ and $V_H$. For this condition, the digital control signals H and G are low, and the output F is at a fixed level whereby the UP/DOWN counter 50 remains at a fixed count. Assume for this condition of $e_{IN}$ and $f_S=F_0/16$ that the output of counter 50 is A=0; B=1; and C=1.

Assume now that $e_{IN}$ increases in amplitude causing $e_0$ to increase, which increase causes $V_D$ to increase and to become more positive than $V_H$. For the condition when $V_D$ is more positive than $V_H$, the signal H goes positive causing UP/DOWN counter 50 to to programmed to count down. The G signal remains low, and the F signal varies (making transitions between High and Low levels corresponding to CP1 or CP2) providing counting pulses to counter 50 which, with H=high and G=low, counts down. The new (lower) count (e.g. A=0, B=1, C=0) of counter 50 is applied to multiplexer 56 and causes a frequency of $F_0/32$ to be selected and to be produced as the $f_S$ and $\overline{f_S}$ signals. The lower switching frequency ($F_0/32$) applied to input network 12 decreases the gain of amplifier 5' and causes $e_0$ and $V_D$ to decrease. If $V_D$ decreases so that it lies between $V_L$ and $V_H$ the H signal goes low, the G signal which was low remains low, and the application of any further counting pulses (F) to counter 50 is inhibited. If $V_D$ is still greater than $V_H$, then the H signal remains high and more counting pulses (F) are applied to counter 50 causing its count to decrease further (e.g., A=0, B=0, C=1). For example, assume that the newer (lower) count cause a frequency of $F_0/64$ to be selected and to be produced as the $f_S$ and $\overline{f_S}$ signals. Assume further that, for $f_S=F_0/64$, $V_D$ lies between $V_L$ and $V_H$. The H and G signals go low and the application of additional F counting pulses is inhibited. The amplifier gain is then fixed with a frequency $F_0$ being applied to the switches in the feedback network 16 and a frequency $F_0/64$ being applied to the switches in the input network 12. Note that if $V_D$ still exceeds $V_H$ that the count down process continues automatically (within the limit of the system) until the amplifier 5' gain decreases to the point that $V_D$ lies between $V_L$ and $V_H$.

Assume now that the ABC output of counter 50 is initially A=0, B=1, C=1 and $f_S=F_0/16$ and that $e_{IN}$ decreases in amplitude causing $e_0$ and $V_D$ to decrease until $V_D$ is less positive than $V_L$. For the condition of $V_D$ being less positive than $V_L$ the G signal goes high while the H signal remains low. When G goes high UP/DOWN counter 50 is programmed to count up in response to the application of counting pulses F. After G goes high assume that an F pulse causes the ABC output of counter 50 to go higher such that A=1, B=0, and C=0. The new higher count of counter 50 controls the output of multiplexer 56 and causes the selection of a higher switching frequency (e.g. $F_0/8$) to be produced as the $f_S$ and $\overline{f_S}$ signals. $f_S$ (and $\overline{f_S}$) which had a frequency of $F_0/16$ prior to the decrease of $e_{IN}$ now increases to $F_0/8$. The increase in the frequency of $f_S$ causes the gain of the amplifier 5' to increase causing $e_0$ and $V_D$ to increase. In an analogous manner to that described above, if $V_D$ increases so that it lies between $V_L$ and $V_H$, the G signal returns to the low level and no further counting pulses F are applied to the UP/DOWN counter. If $e_0$ is such that $V_D$ is still less than $V_L$, additional counting pulses are applied to the UP/DOWN counter and its count increases further. The increased count causes the selection of still higher $f_S$ and $\overline{f_S}$ switching frequencies until the output of amplifier 5' causes $V_D$ to lie between $V_D$ and $V_H$.

The gain of amplifier 5' may be defined by noting the value of $V_D$ and either measuring the frequency of the $f_S$ signals (since $F_0$ is known and the system may be calibrated with respect to $F_0$) or by reading out the value of the ABC control signals knowing that each value of ABC corresponds to a fixed frequency. Thus, the overall system gain is obtained by measuring and noting the digital level of UP/DOWN counter (50) outputs A, B, and C or by the frequency ($f_S$) of the sampling signal. Since $e_0$ is maintained within a well defined range (such that $V_D$ is between $V_H$, $V_L$), it can be applied to measuring or utilization circuitry (such as an analog-to-digital converter) without loading or exceeding the operating range of such circuitry.

The configuration shown was successfully demonstrated with C1=C2 in networks 12 and 16 equal to 54 picofarads, with C3=1000 picofarads, with $F_0$ initially equal to 2 MHZ, and with input signals having a frequency range of 0 to 300 HZ. An AGC range of 256 (48 db) was obtained using the amplifier 5' configuration. That is, $V_D$ was held between $V_H$ and $V_L$ while the frequency ratio of $f_S/F_0$ varied over a range of 1 to 1/256 as $e_{IN}$ was varied.

A wider AGC range can be provided using a larger (more stages) UP/DOWN counter which would control finer sampling frequency increments or else which would be used to control two or more variable-frequency amplifiers connected in cascade.

The system of FIG. 3 has many advantages. It enables the precise control of gain by means of frequency ratios and by means of the ratios of capacitors formed on the same integrated circuit (or in like manner) which can be very accurate. In addition, a frequency output signal or a digital output indicative of the amplifier gain is available (A, B, C output of UP/DOWN counter 50) and an analog output $V_D$ output of integrator 32 is also available. The digital output is particularly valuable when used in a digital signal processing system. This indication, can be used to extend the number of bits available for A/D conversion of the amplifier output $e_0$ on line 27 and of course enables a large dynamic range of input signals to be processed. The gain correction (variation) mechanism achieved by varying the frequency of the sampling signals lends itself to an, efficient and accurate control which is easily integratable.

In the system of FIG. 3 the amplifier 5' gain is controlled by varying the frequency at which the capacitor $C_1$ in network 12 is switched and maintaining constant the frequency ($F_0$) at which the feedback capacitor $C_2$ is switched. However, it should be understood that the sampling frequency at which the input network capacitor $C_1$ is switched may be held constant while the sampling or switching frequency applied to the switches in feedback network 16 could be varied. Alternatively, it should be evident that the sampling frequencies at which both the input and the feedback capacitances are switched could be varied in order to obtain a desired gain.

An automatic gain control circuit embodying the invention was fabricated using commercially available components manufactured by RCA Corporation. These parts were used by way of example only and any other suitable component or components could be used instead.

Figure 4:
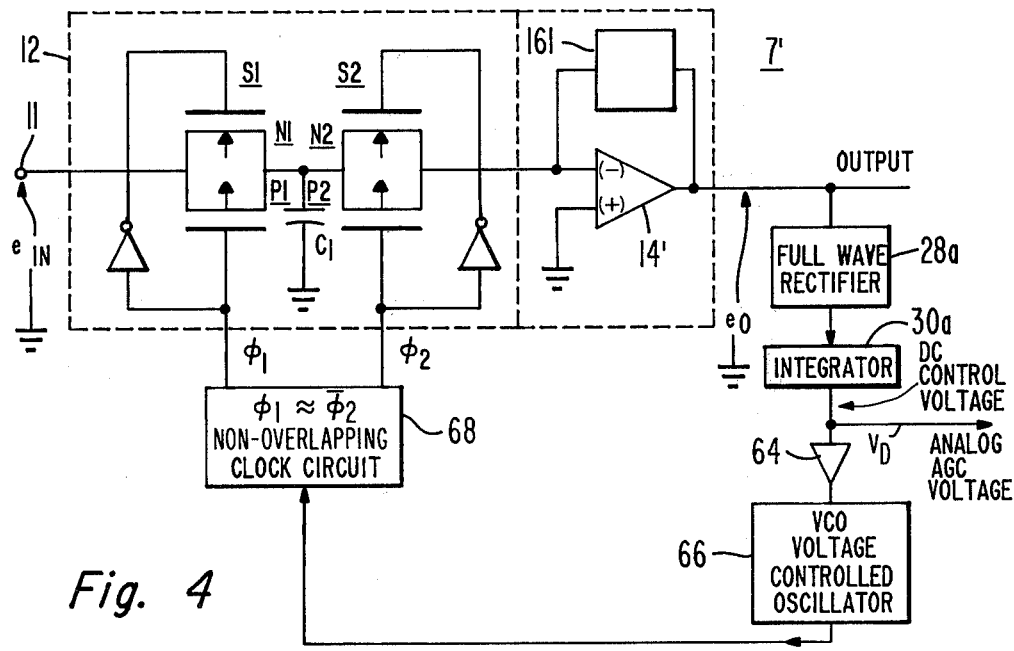
FIG. 4 is a block diagram of still another AGC system embodying the invention.

The system of FIG. 3 may be modified as shown in FIG. 4 where a voltage controlled oscillator (VCO) circuit 66 is used to convert the rectified output of a frequency controlled variable gain amplifier into sampling frequencies $\phi 1$ and $\phi 2$ which control the amplifier gain.

The system includes an amplifier 7' comprised of an input network 12, an amplifier 14' and a feedback network 161. Network 161 may be a feedback resistor ($R_f$) or a suitable switched capacitor circuit as shown in block 16 of FIG. 2. The amplifier 14' output $e_0$ is applied to the input of a full wave rectifier 28a which is connected at its output to the input of an integrator 30a. The direct current (d.c.) voltage output ($V_D$) of the integrator (which is also an analog AGC voltage) is applied via an amplifier 64 to a voltage controlled oscillator (VCO) 66. The output of VCO 66 is a signal whose frequency is a function of the DC voltage applied to its input. The frequency output signal of the VCO is applied to a pulse shaping network 68 which produces the sampling signals $\phi 1$ and $\phi 2$ applied to the gate electrodes of the transistors forming switches S1 and S2.

The operation of the system is briefly as follows: As $e_{IN}$ increases or decreases $e_0$ will likewise increase or decrease causing corresponding changes in the value of $V_D$. Changes in $V_D$ cause the frequency output of oscillator 66 to increase or decrease correspondingly. This, in turn, causes the switching frequency of S1 and S2 to increase and decrease adjusting the gain of the stage and maintaining the output of the amplifier 14' within the desired preselected range. The operation of the servo loop is well known and need not be further detailed. A significant advantage of the system of FIG. 4 is that the gain adjustment is continuous. Feedback network 161 may be a switched capacitor network of the type shown in block 16 of FIG. 2 or a fixed resistor. However, for ease of description assume that it is a switched capacitor network whose; impedance is approximately equal to $1/f_F C_2/$. The frequency variation of $\phi 1$ and $\phi 2$ is continuously variable. The impedance of the input network may be defined as $1/f_I C_1$. The gain of the amplifier 7' stage as per equation 6 above is $AV1 = f_I C_1 / f_F C_2$. For ease of illustration assume C1 is equal to C2. Hence $AV1 = f_I/f_F$. But now the ratio of $f_I$ to $f_F$ may be any number (rather than an integer) greater than zero. This enables a more continuous and gradual control with the gain of the stage being determined by measuring either both the input and feedback sampling frequencies or maintaining one fixed and calibrated and sensing the variations of the other.

What is claimed is:
1. The combination comprising:
 a frequency controlled variable gain amplifier having an input terminal to which an input signal may be applied, an output terminal at which an output signal is produced, and a gain control means, said amplifier being of the type whose voltage gain is a function of the frequency of a sampling signal applied to said gain control means; and
 means, coupled between said output terminal and said gain control means, responsive to the amplitude of said output signal for producing a variable frequency gain control signal whose frequency is a function of said amplitude of said output signal and for applying said gain control signal to said control means for controlling the gain of said amplifier.

2. The combination as claimed in claim 1 wherein said variable gain amplifier includes an operational amplifier having an inverter input node; and wherein said gain control means includes an input network connected between said input terminal and said inverting input node, and a feedback network connected between said output terminal and said inverting input node.

3. The combination as claimed in claim 2 wherein said input network includes: (a) a first switch means connected between said signal input terminal and a first intermediate node; (b) a first capacitor connected between said first intermediate node and a first node; and (c) a second switch means connected between said first intermediate node and said inverting input node;
 wherein said feedback network includes: (a) a third switch means connected between said inverting input node and a second intermediate node; (b) a second capacitor connected between said second intermediate node and a second node; and (c) a fourth switch means connected between said second intermediate node and said output terminal of said amplifier; and
 wherein said means coupled between said output terminal and said gain control means includes means for varying the rate at which said first and second switch means are opened and closed relative to the rate at which said third and fourth switch means are opened and closed.

4. The combination as claimed in claim 3 wherein said third and fourth switch means are alternatively turned on and off, only one of said third and fourth switch means being turned on at any one time.

5. The combination as claimed in claim 4 wherein said first and second switch means are alternatively turned on and off, only one of said first and second switch means being turned on at any one time; and
wherein said first and second nodes are points of reference potential.

6. The combination as claimed in claim 5 wherein said third and fourth switch means are turned on and off at a given rate, and wherein said first and second switch means are turned on and off at a rate which is 1/N said given rate where N is an integer equal to or greater than one (1).

7. The combination as claimed in claim 1 wherein said means coupled between the output terminal of said amplifier and said gain control means includes:
(a) means for rectifying the signal at the output of said amplifier and producing a direct current (d.c.) voltage proportional to the amplitude of the signal;
(b) comparator means responsive to the value of the d.c. voltage for producing a control signal; and
(c) sampling frequency generating means responsive to the control signal for producing a signal whose frequency is dependent on the value of said control signal and for applying said signal to said gain control means.

8. The combination as claimed in claim 3 wherein said feedback network includes means for turning said third and fourth switches on and off at a fixed rate; and
wherein said means coupled between the output terminal of said amplifier and said gain control means includes means for turning said first and second switches on and off at a rate which is a function of the amplitude of the signal at the output terminal of said amplifier.

9. A frequency controlled variable gain amplifier comprising:
an operational amplifier having an inverting input terminal, a non-inverting input terminal and an output terminal;
a signal input terminal;
first and second capacitors;
a first switch connected between one terminal of said first capacitor and said signal input terminal;
a second switch connected between said one terminal of said first capacitor and said inverting input terminal;
a third switch connected between said inverting input terminal and one terminal of said second capacitor;
a fourth switch connected between said one terminal of said second capacitor and said output terminal;
means coupling the other terminal of said first and second capacitors to first and second nodes, respectively;
means coupled to said first, second, third and fourth switches including a first means coupled to said first and second switches for alternately turning them on and off, only one of said first and second switches being turned on at any one time and a second means coupled to said third and fourth switches for alternately turning them on and off, only one of said third and fourth switches being turned on at any one time; and
said first and second means including means responsive to the amplitude of the signal at said output terminal for turning said third and fourth switches on and off at a different rate than said first and second switches.

10. The amplifier as claimed in claim 9 wherein said third and fourth switches are operated at a frequency f and wherein said first and second switches are operated at a frequency which is a submultiple of f.

11. The amplifier as claimed in claim 9 wherein said means for turning said third and fourth switches on and off at a different rate than said first and second switches includes an oscillator and a frequency divider chain for producing different frequency signals and means for applying said different frequency signals to said first, second, third and fourth switches.

12. A frequency controlled variable gain amplifier comprising:
an operational amplifier having an inverting input terminal, a non-inverting input terminal and an output terminal;
a signal input terminal;
an input circuit including switches capacitors whose impedance is a function of the frequency of a sampling signal $f_1$ applied to said input, said input circuit being connected between said signal input terminal and said inverting input;
a feedback circuit including switched capacitors whose impedance is a function of the frequency of a sampling signal $f_2$ applied to said feedback circuit; said feedback circuit being connected between said output terminal and said inverting input terminal; and
means, coupled to said input and feedback circuits, responsive to the amplitude of the signal at said output terminal for generating sampling signals $f_1$ and $f_2$ as a function of said amplitude and for applying said sampling signals $f_1$ and $f_2$ to said circuits for controlling the gain of said amplifier.

* * * * *

UNITED STATES PATENT AND TRADEMARK OFFICE
CERTIFICATE OF CORRECTION

PATENT NO. : 4,429,285
DATED : January 31, 1984
INVENTOR(S) : John L. Bradshaw

It is certified that error appears in the above-identified patent and that said Letters Patent is hereby corrected as shown below:

Col. 2, line 25, change "$\phi 2$" to --- $\overline{\phi 1}$ ---.

Col. 4, line 23, change "wnhich" to --- which ---.

Col. 5, line 17, change "$f_{S1}, f_{S2}, f_{S3},$ and $f_{S4}$" to --- $\overline{f_{S1}}, \overline{f_{S2}}, \overline{f_{S3}},$ and $\overline{f_{S4}}$ ---.

Col. 6, line 64, change "$F_0$" (third occurrence) to --- $\overline{F_0}$ ---.

Col. 7, line 1, change "$F_0$" to --- $\overline{F_0}$ ---.

Col. 7, line 33, change "$f_S$" (second occurrence) to --- $\overline{f_S}$ ---.

Col. 8, line 62 and 63, change "demonostrated" to --- demonstrated ---.

Col. 12, line 37, change "switches" to --- switched ---.

Signed and Sealed this

Twelfth Day of June 1984

[SEAL]

Attest:

GERALD J. MOSSINGHOFF

*Attesting Officer*          *Commissioner of Patents and Trademarks*